United States Patent
Li

(10) Patent No.: US 10,401,741 B2
(45) Date of Patent: Sep. 3, 2019

(54) METHOD AND STRUCTURE FOR DETECTING DISTORTION IN A PATTERN

(71) Applicant: BOE Technology Group Co., Ltd., Beijing (CN)

(72) Inventor: Wusheng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 153 days.

(21) Appl. No.: 15/719,090

(22) Filed: Sep. 28, 2017

(65) Prior Publication Data

US 2018/0246403 A1    Aug. 30, 2018

(30) Foreign Application Priority Data

Feb. 27, 2017 (CN) .......................... 2017 1 0108371

(51) Int. Cl.
| | |
|---|---|
| G03F 7/20 | (2006.01) |
| G03F 7/00 | (2006.01) |
| G03F 7/095 | (2006.01) |
| G03F 7/16 | (2006.01) |
| G03F 7/26 | (2006.01) |
| G03F 1/44 | (2012.01) |
| G03F 1/84 | (2012.01) |
| G01B 21/16 | (2006.01) |
| G01B 21/02 | (2006.01) |

(52) U.S. Cl.
CPC ............ *G03F 7/70641* (2013.01); *G03F 1/44* (2013.01); *G03F 1/84* (2013.01); *G03F 7/0035* (2013.01); *G03F 7/095* (2013.01); *G03F 7/162* (2013.01); *G03F 7/168* (2013.01); *G03F 7/20* (2013.01); *G03F 7/26* (2013.01); *G01B 21/02* (2013.01); *G01B 21/16* (2013.01)

(58) Field of Classification Search
CPC . G03F 1/44; G03F 1/84; G03F 7/0035; G03F 7/095; G03F 7/162; G03F 7/168; G03F 7/20; G03F 7/26; G03F 7/70641
USPC .......................................... 430/5, 30; 257/48
See application file for complete search history.

(56) References Cited

U.S. PATENT DOCUMENTS

2006/0103827 A1    5/2006   Derksen

FOREIGN PATENT DOCUMENTS

| CN | 101226343 A | 7/2008 |
|---|---|---|
| CN | 104460243 A | 3/2015 |
| JP | 2010205553 A | 9/2010 |

OTHER PUBLICATIONS

Notification of the First Office Action for Application No. 20171010837, dated Dec. 1, 2017.

*Primary Examiner* — Christopher G Young

(74) *Attorney, Agent, or Firm* — McAndrews, Held & Malloy, Ltd.

(57) ABSTRACT

Embodiments of the disclosure disclose a method and structure for detecting distortion in a pattern. In this solution, a first photosensitive material is exposed and developed to form a desirable pattern to be detected, and also a detection step including two levels at different heights is formed in a preset detection area of the pattern to be detected; and then a second photosensitive material is exposed and developed according to the same exposure machine parameters to form a detection pattern in the detection area for detecting exposure defocusing, and if preset size parameters of the detection pattern at the two levels of the detection step are consistent, then it is indicated that the formed pattern to be detected is not distorted due to exposure defocusing; otherwise, it is indicated that the pattern to be detected is distorted due to exposure defocusing.

14 Claims, 4 Drawing Sheets

METHOD AND STRUCTURE FOR DETECTING DISTORTION IN A PATTERN

CROSS-REFERENCE TO RELATED APPLICATIONS

This application claims the priority to Chinese Patent Application No. 201710108371.5, filed on Feb. 27, 2017, the content of which is hereby incorporated by reference in its entirety.

FIELD

The present disclosure relates to the field of display technologies, and particularly to a method and structure for detecting distortion in a pattern.

BACKGROUND

A photolithograph process is a key process in manufacturing of a display in which a pattern on a mask is transferred onto a substrate through spin-coating, exposure, and development, where a depth of focus in exposure is an important factor in the exposure process, and if a photosensitive material does not lie in the range of the depth of focus, which is referred to as exposure defocusing, while the display is being produced, then the pattern may be distorted. However in the prior art, the pattern may also be distorted due to other processes, so it may be difficult to determine whether the pattern is distorted due to exposure defocusing, and thus impossible to detect the problem of exposure defocusing in a timely manner.

SUMMARY

The object of the embodiments of the disclosure is attained in the following technical solutions:

An embodiment of the disclosure provides a method for detecting distortion in a pattern, the method including:

coating a first photosensitive material on a substrate;

exposing and developing the first photosensitive material according to preset exposure machine parameters to form a pattern to be detected, and forming a detection step in at least one preset detection area of the pattern to be detected, wherein the detection step includes a first level and a second level at different heights; and the first level and the second level are parallel to a plane where the substrate lies;

coating a second photosensitive material on the substrate;

exposing and developing the second photosensitive material according to the preset exposure machine parameters to form a detection pattern in the detection area for detecting exposure defocusing; and determining whether a preset size parameter of a part of the detection pattern at the first level of the detection step is consistent with a preset size parameter of a part of the detection pattern at the second level of the detection step; and if so, then determining that the pattern to be detected is not distorted in the detection area due to exposure defocusing; otherwise, determining that the pattern to be detected is distorted in the detection area due to exposure defocusing.

An embodiment of the disclosure provides a structure for detecting distortion in a pattern, the structure including: a substrate, a pattern to be detected, on the substrate, formed as a result of exposure and development according to preset exposure machine parameters, a detection step in at least one preset detection area of the pattern to be detected, and a detection pattern in the detection area formed as a result of exposure and development according to the preset exposure machine parameters for detecting exposure defocusing, wherein the detection step includes a first level and a second level at different heights; and the first level and the second level are parallel to a plane where the substrate lies; and if a preset size parameter of a part of the detection pattern at the first level of the detection step is consistent with a preset size parameter of a part of the detection pattern at the second level of the detection step; then it is indicated that the pattern to be detected is not distorted in the detection area due to exposure defocusing; otherwise, it is indicated that the pattern to be detected is distorted in the detection area due to exposure defocusing.

DETAILED DESCRIPTION OF THE EMBODIMENTS

A method and structure for detecting distortion in a pattern according to the disclosure will be described below in further details with reference to the drawings and embodiments thereof.

Figure 1:
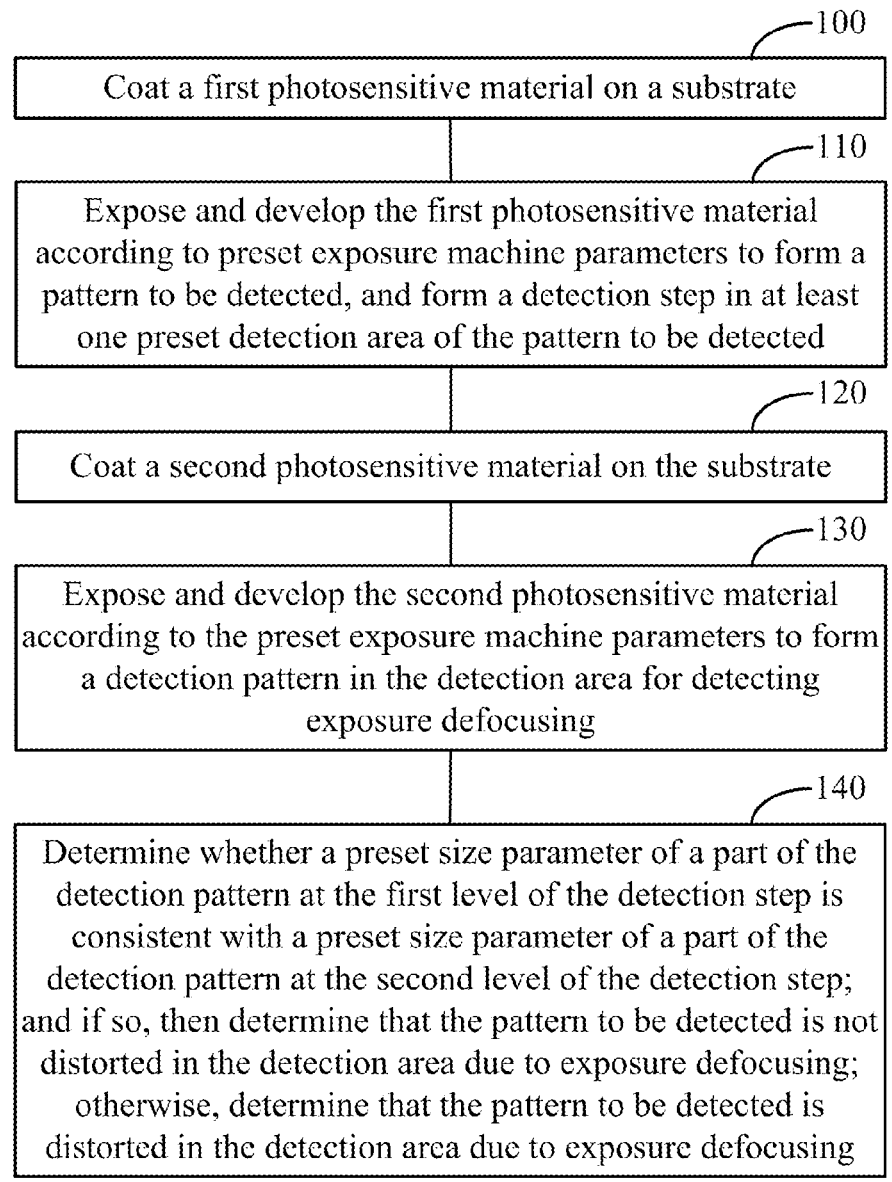
FIG. 1 is a flow chart of a method for detecting distortion in a pattern according to an embodiment of the disclosure.

In order to detect and address exposure defocusing, and distortion in a pattern arising from the problem of exposure defocusing in a timely manner, an embodiment of the disclosure provides a method for detecting distortion in a pattern as illustrated in FIG. 1, where the method includes at least the following operations.

The operation 100 is to coat a first photosensitive material on a substrate;

The operation 110 is to expose and develop the first photosensitive material according to preset exposure machine parameters to form a pattern to be detected, and to form a detection step in at least one preset detection area of the pattern to be detected, where the detection step includes a first level and a second level at different heights; and the first level and the second level are parallel to a plane where the substrate lies;

The operation 120 is to coat a second photosensitive material on the substrate;

The operation 130 is to expose and develop the second photosensitive material according to the preset exposure machine parameters to form a detection pattern in the detection area for detecting exposure defocusing;

The operation 140 is to determine whether a preset size parameter of a part of the detection pattern at the first level of the detection step is consistent with a preset size parameter of a part of the detection pattern at the second level of the detection step; and if so, to determine that the pattern to be detected is not distorted in the detection area due to exposure defocusing; otherwise, to determine that the pattern to be detected is distorted in the detection area due to exposure defocusing.

In the embodiment of the disclosure, the first photosensitive material is exposed and developed to form the desirable pattern to be detected, and also the detection step including the two levels at the different heights is formed in the preset detection area of the pattern to be detected; and then the second photosensitive material is exposed and developed according to the same exposure machine parameters to form the detection pattern in the detection area for detecting exposure defocusing, and if the preset size parameters of the detection pattern at the two levels of the detection step are consistent, then it is indicated that the second photosensitive material lies in the range of a depth of focus if the exposure machine parameters are used for exposure, and since the same exposure machine parameters are used for the first photosensitive material and the second photosensitive material, the first photosensitive material will also lie in the range of the depth of focus, so there will be no exposure defocusing, and the formed pattern to be detected will not be distorted due to exposure defocusing; otherwise, it will be distorted due to exposure defocusing. In this way, exposure defocusing, and the distortion of the pattern due to exposure defocusing can be detected and addressed in a timely manner.

In an implementation, the position of a focus plane of an exposure machine in exposure needs to be adjusted upon detection of exposure defocusing.

In a particular implementation, there are a number of implementations in which the detection step is formed, and several of them will be exemplified below.

Figure 2:
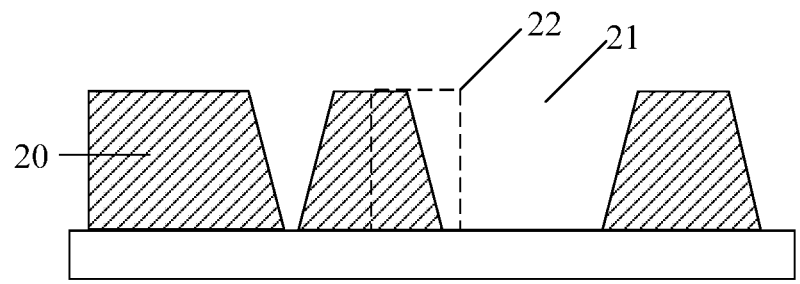
FIG. 2 is a schematic structural diagram of a detection step according to an embodiment of the disclosure.

Optionally the detection step can be formed in the at least one preset detection area of the pattern to be detected in the operation 110 particularly as follows: a groove 21 is formed in the at least one preset detection area of the pattern 20 to be detected, to form the step 22 as illustrated in FIG. 2, where a level inside the groove 21, and a level outside the groove 22 are the two levels of the step 22.

Figure 3:
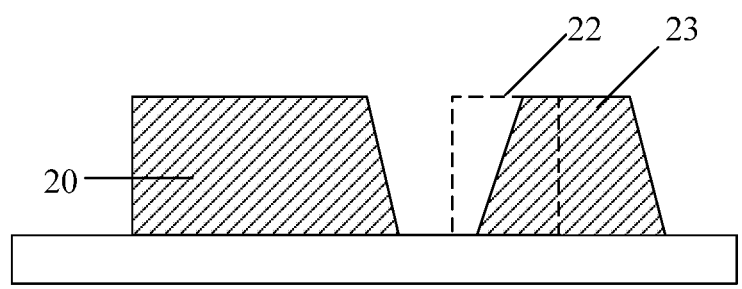
FIG. 3 is a schematic structural diagram of another detection step detected according to an embodiment of the disclosure.

Or optionally the detection step can be formed in the at least one preset detection area of the pattern to be detected in the operation 110 particularly as follows: a protrusion 23 is formed in the at least one preset detection area of the pattern 20 to be detected, to form the step 22 as illustrated in FIG. 3, where a level at the top of the protrusion 23, and a level at the bottom of the protrusion 23 are the two levels of the step 22.

Figure 4:
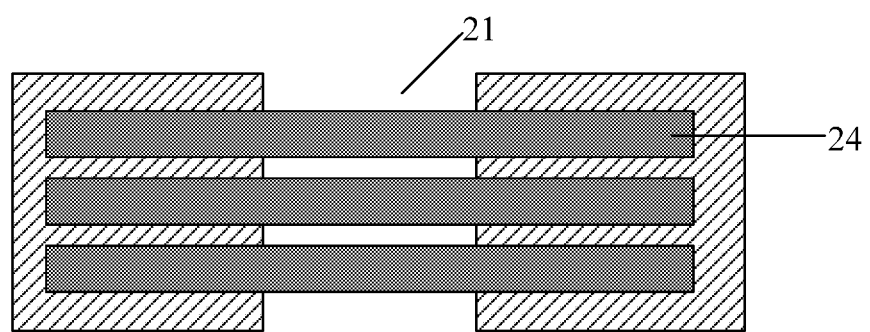
FIG. 4 is a schematic structural diagram of a detection pattern arranged on the detection step as illustrated in FIG. 2 according to an embodiment of the disclosure.
Figure 5:
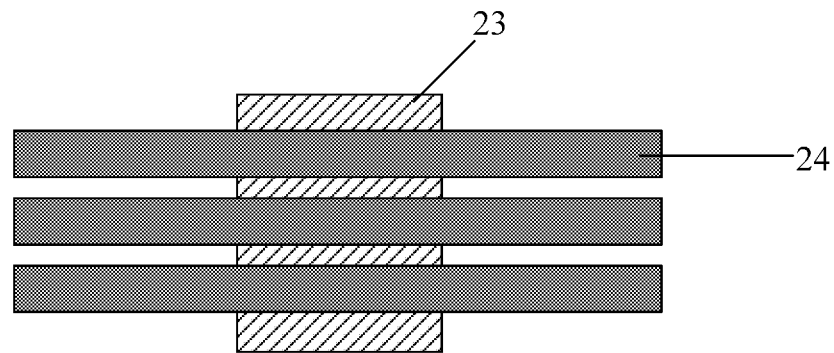
FIG. 5 is a schematic structural diagram of a detection pattern arranged on the detection step as illustrated in FIG. 3 according to an embodiment of the disclosure.
Figure 6:
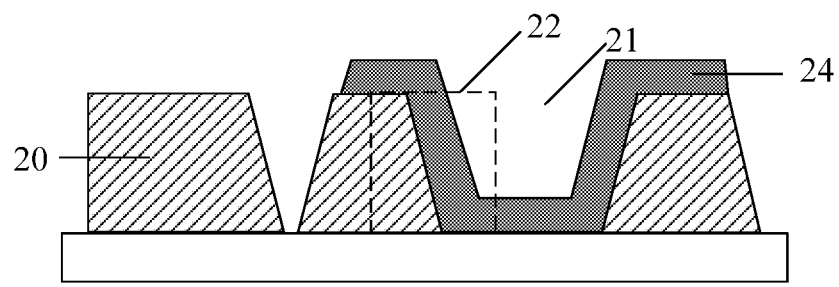
FIG. 6 is a schematic sectional view of the structure as illustrated in FIG. 4 according to an embodiment of the disclosure.
Figure 7:
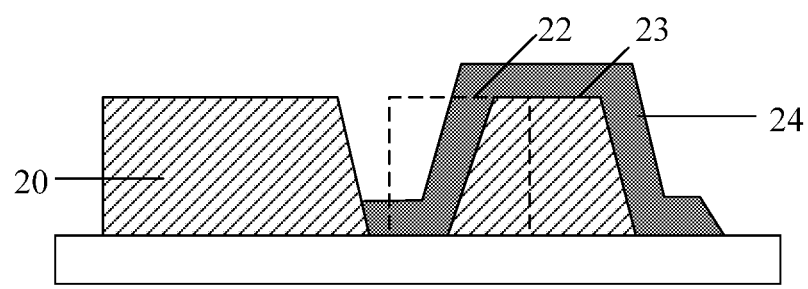
FIG. 7 is a schematic sectional view of the structure as illustrated in FIG. 5 according to an embodiment of the disclosure.

In a particular implementation, the detection pattern in the detection area for detecting exposure defocusing can be formed in the operation 130 particularly as follows: at least one strip-shaped detection pattern is formed in the detection area, where a positive projection of the strip-shaped detection pattern 24 onto the substrate intersects with a positive projection of the detection step onto the substrate as illustrated in FIG. 4 and FIG. 5. FIG. 6 and FIG. 7 illustrate sectional views thereof in the direction of the detection pattern.

If the detection step 22 is formed by forming the groove 21, then correspondingly it may be determined in the operation 140 whether the preset size parameter of a part of the detection pattern at the first level of the detection step is consistent with the preset size parameter of a part of the detection pattern at the second level of the detection step particularly as follows.

It is determined whether a line width of a part of the strip-shaped pattern inside the groove is consistent with a line width of a part of the strip-shaped pattern outside the groove.

Or it is determined whether a spacing between parts of respective strip-shaped patterns inside the groove is consistent with a spacing between parts of the respective strip-shaped patterns outside the groove.

If the detection step 22 is formed by forming the protrusion 23, then correspondingly it may be determined in the operation 140 whether the preset size parameter of a part of the detection pattern at the first level of the detection step is consistent with the preset size parameter of a part of the detection pattern at the second level of the detection step particularly as follows.

It is determined whether a line width of a part of the strip-shaped pattern at the top of the protrusion is consistent with a line width of a part of the strip-shaped pattern at the bottom of the protrusion.

Or it is determined whether a spacing between parts of respective strip-shaped patterns at the top of the protrusion is consistent with a spacing between parts of the respective strip-shaped patterns at the bottom of the protrusion.

Here the line width and the spacing are the preset size parameter above. Of course, the detection pattern can alternatively be arranged in another shape as needed, and the corresponding preset parameter size can be detected.

In a particular implementation, the accuracy of a detection result is affected by the thickness of the coated second photosensitive material to some extent in that if the photosensitive material is too thick, then the two levels of the formed detection step may go beyond the first photosensitive material, thus discouraging the detection; and in order to avoid this problem, the thickness of the second photosensitive material is optionally less than the thickness of the first photosensitive material. As can be apparent from FIG. 6 and FIG. 7, if the second photosensitive material is thinner, then the formed detection pattern 24 will approximate to the two levels of the detection step 22, and the detection result will be more accurate. Accordingly the solution according to the embodiment of the disclosure will be more applicable to a pattern to be detected for a thicker film layer. For example, there is generally a thicker film layer of a dielectric layer, so a pattern formed of the first photosensitive material may be a pattern of the dielectric layer.

In a particular implementation, optionally the detection step is distributed in a non-pixel area so that a pixel area can be avoided from being affected by the detection step to thereby alleviate an influence on an image to be displayed.

Furthermore in order to determine conveniently the size parameter of the detection pattern, optionally the detection step is distributed in a peripheral area of the pattern to be detected. Particularly the detection step may be distributed at a corner of the pattern to be detected, and/or at the middle of a side of the pattern to be detected without any limitation thereto.

In a particular implementation, optionally the first photosensitive material and the second photosensitive material may be selected from a plurality of photosensitive materials, and these two photosensitive materials may or may not be the same. If the two photosensitive materials are the same, then on one hand, the photosensitive material will not be changed to thereby improve the efficiency; and on the other hand, the two exposure conditions will be the same, and the detection will be more accurate. Optionally the first photosensitive material and the second photosensitive material are resin.

After the pattern to be detected is detected, in order to facilitate a subsequent process, or to address the problem of exposure defocusing, optionally the method according to the embodiment of the disclosure further includes: removing the detection pattern.

A method for detecting distortion in a pattern according to an embodiment of the disclosure will be described below in further details in connection with a particular scenario.

Figure 8:
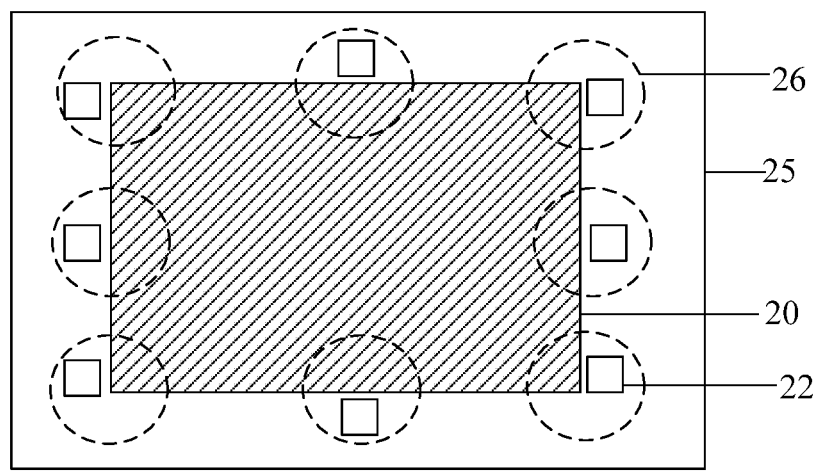
FIG. 8 is a schematic structural diagram of a mask according to an embodiment of the disclosure.

In this embodiment, there are two masks to be used, and as illustrated in FIG. 8, in addition to a pattern 20 to be detected, a first mask 25 includes detection areas 26 arranged respectively at corners of a peripheral area of the pattern to be detected, and at the middle of respective sides of the pattern to be detected, and detection steps 22 arranged in the respective detection areas, i.e., patterns of grooves; and a second mask includes the detection patterns arranged in the detection areas. Since the size of a mask is limited in a real process, a plurality of the first masks as illustrated in FIG. 8 need to be arranged on a substrate. In this embodiment, the first photosensitive material in use is resin, and used to form patterns of a dielectric layer, and after all the processes before the resin is coated are performed, a flow according to the embodiment of the disclosure is performed in the following operations.

The first operation is to coat the resin on the substrate.

Particularly the resin is coated at an initial rotation speed of 200 to 400 rpm/5 s and optionally 300 rpm/5 s, and a final rotation speed of 700 to 900 rpm/5 s and optionally 830 rpm/5 s, and pre-baked at temperature of 100 degrees centigrade for 120 seconds.

The second operation is to expose and develop the resin using the first mask according to preset exposure machine parameters of an amount of exposure which is 200 mJ, a development period of time which is 80 seconds, a blanching rate of 1.2 uvm/min, curing temperature of 230 degrees centigrade, and a period of time which is 45 minutes, and thereafter dry-etch the resin at ashing power of 800 w, pressure of 200 mtor, and a flow rate of $SF6/O2=30/300$ sccm, to form the patterns of the dielectric layer, and also form grooves in the detection areas of the patterns of the dielectric layer.

The third operation is to coat photo-resist on the substrate.

The fourth operation is to expose and develop the photo-resist using the second mask according to the preset exposure parameters in the second operation to form a plurality of strip-shaped detection patterns, where a positive projection of a strip-shaped detection pattern onto the substrate intersects with a positive projection of a groove onto the substrate;

The fifth operation is to determine whether a line width of a part of a strip-shaped pattern inside a groove is consistent with a line width of a part of the strip-shaped pattern outside the groove; or to determine whether a spacing between parts of respective strip-shaped patterns inside a groove is consistent with a spacing between of the respective strip-shaped patterns outside the groove; and if so, to determine that the patterns to be detected are not distorted in the detection areas due to exposure defocusing; otherwise, to determine that the patterns to be detected are distorted in the detection areas due to exposure defocusing.

The sixth operation is to remove the photo-resist.

Based upon the same inventive idea, an embodiment of the disclosure further provides a structure for detecting distortion in a pattern, where the structure includes: a substrate, a pattern to be detected, on the substrate, formed as a result of exposure and development according to preset exposure machine parameters, a detection step in at least one preset detection area of the pattern to be detected, and a detection pattern in the detection area formed as a result of exposure and development according to the preset exposure machine parameters for detecting exposure defocusing;

Where the detection step includes a first level and a second level at different heights; and the first level and the second level are parallel to a plane where the substrate lies;

If a preset size parameter of a part of the detection pattern at the first level of the detection step is consistent with a preset size parameter of a part of the detection pattern at the second level of the detection step; then it is indicated that the pattern to be detected is not distorted in the detection area due to exposure defocusing; otherwise, it is indicated that the pattern to be detected is distorted in the detection area due to exposure defocusing.

In the method and structure for detecting distortion in a pattern according to the embodiments of the disclosure, the first photosensitive material is exposed and developed to form the desirable pattern to be detected, and also the detection step including the two levels at the different heights is formed in the preset detection area of the pattern to be detected; and then the second photosensitive material is exposed and developed according to the same exposure machine parameters to form the detection pattern in the detection area for detecting exposure defocusing, and if the preset size parameters of the detection pattern at the two levels of the detection step are consistent, then it is indicated that the second photosensitive material lies in the range of a depth of focus if the exposure machine parameters are used for exposure, and since the same exposure machine parameters are used for the first photosensitive material and the second photosensitive material, the first photosensitive material will also lie in the range of the depth of focus, so there will be no exposure defocusing, and the formed pattern to be detected will not be distorted due to exposure defocusing; otherwise, it will be distorted due to exposure defocusing. In this way, exposure defocusing, and the distortion of the pattern due to exposure defocusing can be detected and addressed in a timely manner.

Evidently those skilled in the art can make various modifications and variations to the disclosure without departing from the spirit and scope of the disclosure. Accordingly the disclosure is also intended to encompass these modifications and variations thereto so long as the modifications and variations come into the scope of the claims appended to the disclosure and their equivalents.

The invention claimed is:

1. A method for detecting distortion in a pattern, the method comprising:
    coating a first photosensitive material on a substrate;
    exposing and developing the first photosensitive material according to preset exposure machine parameters to form a pattern to be detected, and forming a detection step in at least one preset detection area of the pattern to be detected, wherein the detection step comprises a first level and a second level at different heights; and the first level and the second level are parallel to a plane where the substrate lies;
    coating a second photosensitive material on the substrate;
    exposing and developing the second photosensitive material according to the preset exposure machine parameters to form a detection pattern in the detection area for detecting exposure defocusing; and determining whether a preset size parameter of a part of the detection pattern at the first level of the detection step is consistent with a preset size parameter of a part of the detection pattern at the second level of the detection step; and if so, then determining that the pattern to be detected is not distorted in the detection area due to exposure defocusing; otherwise, determining that the pattern to be detected is distorted in the detection area due to exposure defocusing.

2. The method according to claim 1, wherein the thickness of the second photosensitive material is less than the thickness of the first photosensitive material.

3. The method according to claim 1, wherein forming the detection pattern in the detection area for detecting exposure defocusing comprises:

forming at least one strip-shaped detection pattern in the detection area, wherein a positive projection of the strip-shaped detection pattern onto the substrate intersects with a positive projection of the detection step onto the substrate.

4. The method according to claim 3, wherein forming the detection step in the at least one preset detection area of the pattern to be detected comprises:

forming a protrusion in the at least one preset detection area of the pattern to be detected, to form the detection step.

5. The method according to claim 4, wherein determining whether the preset size parameter of a part of the detection pattern at the first level of the detection step is consistent with the preset size parameter of a part of the detection pattern at the second level of the detection step comprises:

determining whether a line width of a part of the strip-shaped pattern at the top of the protrusion is consistent with a line width of a part of the strip-shaped pattern at the bottom of the protrusion; or determining whether a spacing between parts of respective strip-shaped patterns at the top of the protrusion is consistent with a spacing between parts of the respective strip-shaped patterns at the bottom of the protrusion.

6. The method according to claim 3, wherein forming the detection step in the at least one preset detection area of the pattern to be detected comprises:

forming a groove in the at least one preset detection area of the pattern to be detected, to form the detection step.

7. The method according to claim 6, wherein determining whether the preset size parameter of a part of the detection pattern at the first level of the detection step is consistent with the preset size parameter of a part of the detection pattern at the second level of the detection step comprises:

determining whether a line width of a part of the strip-shaped pattern inside the groove is consistent with a line width of a part of the strip-shaped pattern outside the groove; or determining whether a spacing between parts of respective strip-shaped patterns inside the groove is consistent with a spacing between parts of the respective strip-shaped patterns outside the groove.

8. The method according to claim 1, wherein the detection step is distributed in a non-pixel area.

9. The method according to claim 1, wherein the detection step is distributed in a peripheral area of the pattern to be detected.

10. The method according to claim 9, wherein the detection step is distributed at a corner of the pattern to be detected, and/or at the middle of a side of the pattern to be detected.

11. The method according to claim 1, wherein the first photosensitive material and the second photosensitive material are the same photosensitive material.

12. The method according to claim 11, wherein both the first photosensitive material and the second photosensitive material are resin.

13. The method according to claim 1, wherein the method further comprises:

removing the detection pattern.

14. A structure for detecting distortion in a pattern, the structure comprising: a substrate, a pattern to be detected, on the substrate, formed as a result of exposure and development according to preset exposure machine parameters, a detection step in at least one preset detection area of the pattern to be detected, and a detection pattern in the detection area formed as a result of exposure and development according to the preset exposure machine parameters for detecting exposure defocusing, wherein:

the detection step comprises a first level and a second level at different heights; and the first level and the second level are parallel to a plane where the substrate lies; and if a preset size parameter of a part of the detection pattern at the first level of the detection step is consistent with a preset size parameter of a part of the detection pattern at the second level of the detection step; then it is indicated that the pattern to be detected is not distorted in the detection area due to exposure defocusing; otherwise, it is indicated that the pattern to be detected is distorted in the detection area due to exposure defocusing.

* * * * *